(12) United States Patent
Hahn et al.

(10) Patent No.: US 11,551,840 B2
(45) Date of Patent: *Jan. 10, 2023

(54) FEEDBACK CONTROL FOR NO-INSULATION HIGH-TEMPERATURE SUPERCONDUCTING MAGNET

(71) Applicants: Seungyong Hahn, Tallahassee, FL (US); David Larbalestier, Tallahassee, FL (US)

(72) Inventors: Seungyong Hahn, Tallahassee, FL (US); David Larbalestier, Tallahassee, FL (US)

(73) Assignee: The Florida State University Research Foundation, Inc.

(*) Notice: Subject to any disclaimer, the term of this patent is extended or adjusted under 35 U.S.C. 154(b) by 0 days.

This patent is subject to a terminal disclaimer.

(21) Appl. No.: 17/386,517

(22) Filed: Jul. 27, 2021

(65) Prior Publication Data

US 2022/0102040 A1    Mar. 31, 2022

Related U.S. Application Data

(63) Continuation of application No. 16/182,121, filed on Nov. 6, 2018, now Pat. No. 11,094,438, which is a continuation of application No. PCT/US2017/031568, filed on May 8, 2017.

(60) Provisional application No. 62/332,503, filed on May 6, 2016.

(51) Int. Cl.
*H01F 6/00*     (2006.01)
*G01R 33/3815*  (2006.01)
*H01F 6/06*     (2006.01)

(52) U.S. Cl.
CPC .......... *H01F 6/008* (2013.01); *G01R 33/3815* (2013.01); *H01F 6/006* (2013.01); *H01F 6/06* (2013.01)

(58) Field of Classification Search
CPC ............ H01F 6/008; H01F 6/006; H01F 6/06; G01R 33/3815
See application file for complete search history.

(56) References Cited

U.S. PATENT DOCUMENTS

| | | | |
|---|---|---|---|
| 5,004,724 | A | 4/1991 | De |
| 9,117,578 | B2 | 8/2015 | Hahn |
| 2005/0111159 | A1 | 5/2005 | Knight |
| 2006/0237660 | A1 | 10/2006 | Sasaki et al. |
| 2006/0261889 | A1 | 11/2006 | Giovannotto |
| 2012/0088674 | A1 | 4/2012 | Faley et al. |
| 2012/0157318 | A1 | 6/2012 | Findlay et al. |

(Continued)

FOREIGN PATENT DOCUMENTS

EP    0406024 A2    1/1991

OTHER PUBLICATIONS

Kim, S. et al., Method for generating linear current-field characteristics and eliminating charging delay in no-insulation superconducting magnets, Supercond. Sci. Technol. 30 (2017) 035020 (5 pp).

(Continued)

*Primary Examiner* — Mohamad A Musleh
(74) *Attorney, Agent, or Firm* — Eversheds Sutherland (US) LLP

(57) ABSTRACT

An active feedback controller for a power supply current of a no-insulation (NI) high-temperature superconductor (HTS) magnet to reduce or eliminate the charging delay of the NI HTS magnet and to linearize the magnet constant.

20 Claims, 4 Drawing Sheets

(56) References Cited

U.S. PATENT DOCUMENTS

2014/0296078 A1   10/2014  Oh et al.
2015/0213930 A1    7/2015  Hahn et al.
2016/0086707 A1    3/2016  Hahn

OTHER PUBLICATIONS

International Search Report and Written Opinion of the International Searching Authority dated Jul. 19, 2017 for corresponding PCT International Application No. PCT/US2017/031568 (9 pp).

FEEDBACK CONTROL FOR NO-INSULATION HIGH-TEMPERATURE SUPERCONDUCTING MAGNET

CROSS-REFERENCE TO RELATED APPLICATIONS

This application is a continuation of and claims priority to U.S. application Ser. No. 16/182,121, entitled "FEEDBACK CONTROL FOR NO-INSULATION HIGH-TEMPERATURE SUPERCONDUCTING MAGNET", filed Nov. 6, 2018 by the same inventors, which is a continuation of and claims priority to International Patent Application No. PCT/US2017/031568, entitled "FEEDBACK CONTROL FOR NO-INSULATION HIGH-TEMPERATURE SUPERCONDUCTING MAGNET," filed May 8, 2017 by the same inventors, which claims priority to U.S. Provisional Patent Application No. 62/332,503, entitled "Feedback Control of No-Insulation High-temperature Superconducting Magnet," filed on May 6, 2016, the entirety of which is hereby incorporated by reference.

FEDERALLY SPONSORED RESEARCH OR DEVELOPMENT

This invention was made with Government support under Grant Nos. 227000-550-36404 and 227000-550-003597 awarded by the National High Magnetic Field Laboratory (NHMFL). The government has certain rights in the invention.

BACKGROUND OF THE INVENTION

For high field superconducting magnets, rare-earth barium copper $REBa_2Cu_3O_{7-x}$ (REBCO) tape is a promising option due to its strong mechanical properties and excellent in-field current carrying capacity. The great challenge of magnet protection however, has been one of the major impediments to widespread use of REBCO for high field magnets. No-insulation (NI) high-temperature superconducting (HTS) winding techniques have provided a feasible solution for protection of direct current (DC) high field REBCO magnets, even when designed to be operated at a substantially higher current density, >400 A $mm^{-2}$, than that of the convention insulated REBCO magnets, typically 200 A $mm^{-2}$, or less.

A standalone 26.4 T, 35 mm, all-REBCO NI magnet has been successfully constructed and energized and its self-protecting features have been demonstrated in multiple quench tests without requiring any additional quench detection and protection systems. However, one of the residual concerns for future NI REBCO high field magnets is the charging delay due to the internal turn-to-turn shorts which are known to occur within NI coils. The turn-to-turn leakage current path induced by the absence of insulation introduces nonlinearities into the magnetic field current characteristic and results in significant delay in reaching the desired field.

One approach to mitigating charging delays due to the internal turn-to-turn shorts is to increase the turn-to-turn contact resistance in the NI coil without sacrificing the self-protecting feature of the coil. While this approach has been successful to some extent, improvements are still needed to mitigate the charging delays in the NI coils resulting from the internal turn-to-turn shorts.

Accordingly, what is needed in the art is a technique and device to mitigate the nonlinearity and associated charging delay that is inherent in a non-insulation (NI) high-temperature superconductor (HTS) coil. However, in view of the art considered as a whole at the time the present invention was made, it was not obvious to those of ordinary skill in the field of this disclosure how the shortcomings of the prior art could be overcome.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of various embodiments, Applicants in no way disclaim these technical aspects, and it is contemplated that the present disclosure may encompass one or more of the conventional technical aspects discussed herein.

The present disclosure may address one or more of the problems and deficiencies of the prior art discussed above. However, it is contemplated that various embodiments may prove useful in addressing other problems and deficiencies in a number of technical areas. Therefore, the present disclosure should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

In various embodiments of the present invention, an active feedback control system is provided to operate the NI HTS magnet. Active control of a current of a power supply for the NI HTS magnet may provide operational solutions for the charge delay and non-linear magnet constant. The active control system may be advantageous for application of the NI HTS technique to actual high field use magnets.

In one embodiment, the present invention provides a method to reduce the charging delay and steady-state magnetic field instability of a no-insulation (NI) high-temperature superconductor (HTS) coil. The method includes, establishing a reference magnetic field for a no-insulation (NI) high-temperature superconductor (HTS) coil, exciting the NI HTS coil with a power supply, monitoring a difference between the reference magnetic field and a measured magnetic field of the NI HTS coil and controlling a current of the power supply using a feedback loop to track the reference magnetic field based upon the difference between the reference magnetic field and the measured magnetic field.

Controlling the current of the power supply further includes controlling the current of the power supply in accordance with a transfer function and in a particular embodiment, the transfer function is a ratio of the measured magnetic field ($\tilde{B}$) of the NI HTS coil and the current of the power supply ($\tilde{I}_p$) and is equal to:

$$\frac{\tilde{B}(s)}{\tilde{I}_{P(s)}} = \frac{\alpha R_c}{Ls + R_c}$$

wherein, a is a magnetic constant of the NI HTS coil, $R_c$ is the contact resistance of the NI HTS coil and L is the magnet inductance of the NI HTS coil.

In an additional embodiment, the present invention provides a system to reduce the charging delay and steady-state magnetic field instability of a no-insulation (NI) high-temperature superconductor (HTS) coil. The system includes a reference magnetic field for a no-insulation (NI) high-temperature superconductor (HTS) coil, a magnetic field sensor coupled to the NI HTS coil, the magnetic field sensor to output a measured magnetic field of the NI HTS coil and a proportional integral (PI) controller coupled to the reference magnetic field and to the output of the magnetic field sensor. The PI controller is used for monitoring a difference between the reference magnetic field and the measured magnetic field of the NI HTS coil and for controlling a current of a power supply using a feedback loop to track the reference magnetic field based upon the difference between the reference magnetic field and the measured magnetic field when the NI HTS coil is excited by the power supply.

In a particular embodiment, the PI controller of the system controls the current of the power supply in accordance with a transfer function that is a ratio of the measured magnetic field ($\tilde{B}$) of the NI HTS coil and the current of the power supply ($\tilde{I}_p$) and is equal to:

$$\frac{\tilde{B}(s)}{\tilde{I}_P(s)} = \frac{\alpha R_c}{Ls + R_c}$$

wherein, α is a magnetic constant of the NI HTS coil, $R_c$ is the contact resistance of the NI HTS coil and L is the magnet inductance of the NI HTS coil.

The long-standing but heretofore unfulfilled need for an active feedback control system to operate a NI HTS magnet to achieve a reduction or elimination of the charge delay of the magnet and thereby linearize the magnet constant is now met by a new, useful, and nonobvious invention.

These and other important objects, advantages, and features of various embodiments will become dear as this disclosure proceeds.

The present disclosure accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

In the following detailed description of the preferred embodiments, reference is made to the accompanying drawings, which form a part thereof, and within which are shown by way of illustration specific embodiments by which the invention may be practiced. His to be understood that other embodiments may be utilized and structural changes may be made without departing from the scope of the invention.

No-insulation high-temperature superconductor (NI HTS) winding techniques have been effective in building an extremely compact, stable, and mechanically robust HTS magnet. However, the inherent partially shorted radial current path and the designed spiral path inherent in the turn-to-turn contacts of this design cause two problems: (1) there may be substantial charge delay of the magnet, in which the generated magnetic field lags the expected field generated by the charging current, and (2) this charging delay may produce a nonlinear magnet constant (calculated as the center field divided by the magnet current).

In the present invention, various embodiments comprise an active feedback control system to operate the NI HTS magnet. Active control of a current of a power supply for the NI HTS magnet provides an operational solution for the charge delay and nonlinear magnet constant. The active feedback control provided by the present invention mitigates both the nonlinearity and the changing delay. The active control system of the present invention is advantageous for application of the NI HTS technique to actual high field user magnets. With the present invention, one of the most significant perceived disadvantages of an NI magnet can essentially be removed through active feedback control of the power supply current.

In an exemplary embodiment, Table 1 (shown below) summarizes the key parameters of a test magnet for demonstrating the features of the present invention.

TABLE 1

Key parameters of the multi-width (MW) no-insulation (NI) magnet

| Parameter | C1 | C2 | C3 | C4 | C5 |
|---|---|---|---|---|---|
| Measured dimensions | | | | | |
| Average tape width (mm) | 4.1 | 5.1 | 6.1 | 7.1 | 8.1 |
| Min. self-field $I_c$ at 77K (A) | 171 | 190 | 236 | 270 | 300 |
| ID; average OD (mm) | | | 78.0; 101.8 | | |
| Overall height (mm) | | | 154.6 | | |
| Number of DP | 5 | 2 | 2 | 2 | 2 |
| Turn per pancake | | | 140 | | |
| Conductor per DP (m) | | | 80 | | |

TABLE 1-continued

Key parameters of the multi-width (MW) no-insulation (NI) magnet

| Parameter | C1 | C2 | C3 | C4 | C5 |
|---|---|---|---|---|---|
| Operational characteristics | | | | | |
| Magnet constant, α (mTA$^{-1}$) | | | 29.2 | | |
| Total Inductance, L (H) | | | 0.528 | | |
| Measured coil I$_c$ at 77K (A) | | | 41.4 | | |
| Measured coil I$_c$ at 4.2K (A) | | | 312 | | |

Figure 1:
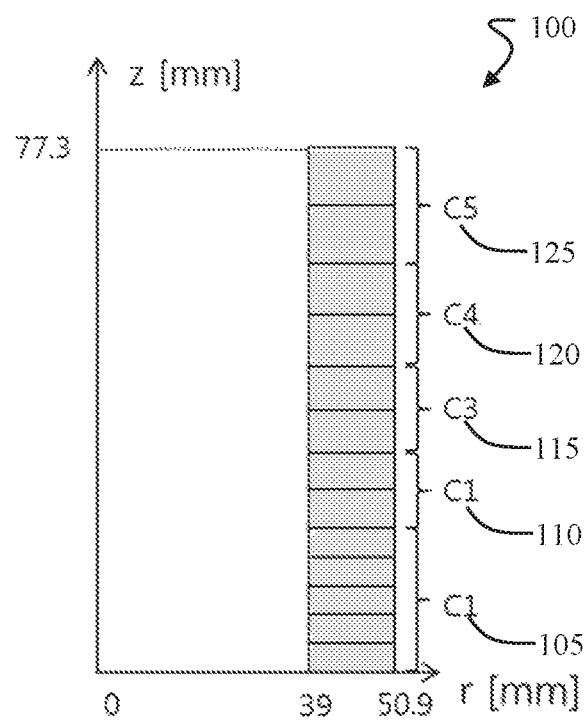
FIG. 1 is a diagrammatic view of the multi-width pancake stacks above the magnet mid-plane (z=0), in accordance with an exemplary embodiment of an NI HTS magnet of the present invention.

As illustrated in FIG. 1, in an exemplary embodiment to illustrate the invention, the multi-width (MW) technique is essentially a conductor grading technique in which the 13 double-pancake (DP) coils 100 were wound with NI REBCO tapes of five different tape widths: 4.1 mm (C1) 105, 5.2 mm (C2) 110, 6.1 mm (C3) 115, 7.1 mm (C4) 120 and 8.1 mm (C5) 125. FIG. 1 illustrates a drawing of the upper half of the magnet. In one experiment, when operated in a bath of liquid helium at 4.2 KJ, the exemplary magnet surpassed a design magnetic field of 7 T and reached 9 T before being quenched at 895 A mm$^{-2}$. The self-protecting behavior of the magnet was demonstrated through multiple quench tests at 4.2 K as well as 77 K. Although the exemplary magnet was designed for use in liquid helium, control simulations and tests were conducted, for ease of testing, in liquid nitrogen at 77 K.

To simulate the 3D electromagnetic behavior of an NI coil, a distributed network model was used to calculate the coil's local current distribution in both azimuthal and radial directions. However, a simple charging analysis was employed wherein the NI magnet was modeled with a lumped circuit consisting of an inductor (L) representing the magnet's overall inductance and a parallel resistor (R$_c$) that essentially sums all of the turn-to-turn contact resistance values. This lumped circuit model has been shown to be reasonably successful in NI coil research for the simulation of charging responses and post-quench behavior of various NI coils.

Figure 2:
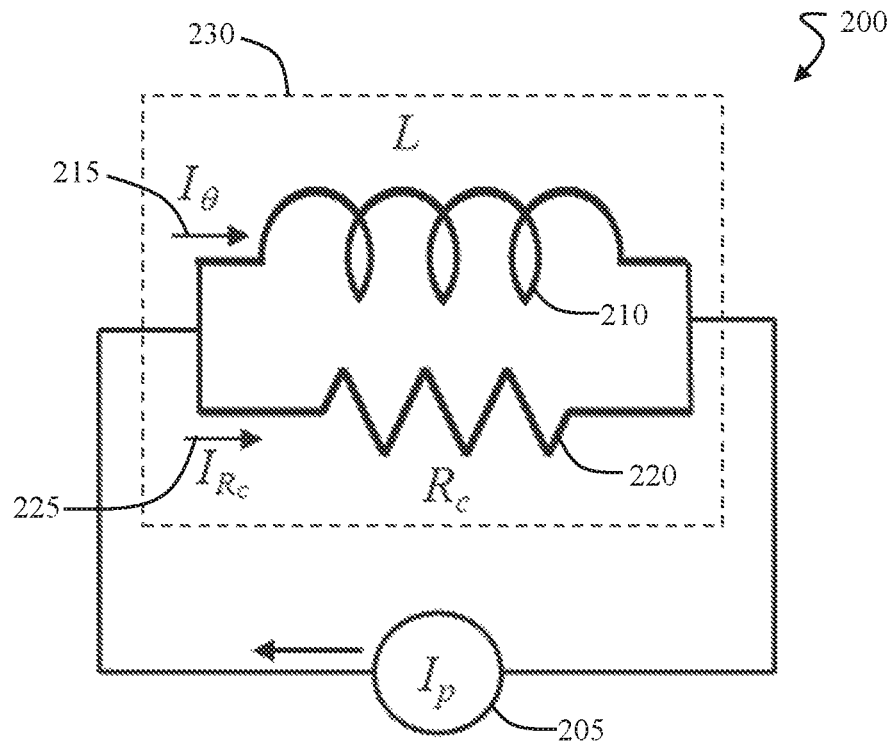
FIG. 2 is a schematic illustration of the equivalent electrical model for an NI HTS magnet with a current source, in accordance with an embodiment of the present invention.

FIG. 2 is a schematic circuit diagram 200 of an equivalent electrical circuit model for a no-insulation HTS magnet 230 with a current source 205. In this model, a power supply current (I$_p$) 205 divides into a spiral current (I$_\theta$) 215 that generates an axial magnetic field and a radial leakage current (I$_{R_c}$) 225 through the contact resistance R 220. Equations (1) and (2) are the circuit equations for FIG. 2, wherein B is the magnet center field proportional to the spiral current I$_\theta$ 215 with a magnet constant in equation (3). The magnet inductance, L 210 was calculated and the contact resistance R$_c$ 220 was estimated to be 3.5 mΩ from measured magnetic fields and magnet voltages in a separate charging test, allowing the charging time constant (τc=L/R$_c$) to be determined as 150 s.

$$L\frac{dI_\theta(t)}{dt} = R_c I_{R_c}(t) \quad (1)$$

$$I_p(t) = I_{R_c}(t) + I_\theta(t) \quad (2)$$

$$B(t) = \alpha \times I_\theta(t) \quad (3)$$

By applying the Laplace transform to equations (1)-(3), the overall system transfer function for the central magnetic field ($\tilde{B}$) can be obtained with respect to the output power supply current ($\tilde{I}_p$) in equation (4), which is the transfer function for the control simulation in the exemplary embodiment.

$$\frac{\tilde{B}(s)}{\tilde{I}_p(s)} = \frac{\alpha R_c}{Ls + R_c} \quad (4)$$

In the present invention, the key principle of "fast tracking" of the target magnetic field is that the proportional-integral (PI) controller monitors the discrepancy between the reference magnetic field and the actual measured magnetic field and then controls the additional power supply current required to track the reference magnetic field as long as the operation limits of the power supply voltage and power supply current are met. During this procedure, the azimuthal current in the coil, which generates the center field, is usually smaller than the power supply current, mainly due to the radial leakage current through the turn-to-turn contacts.

Figure 3:
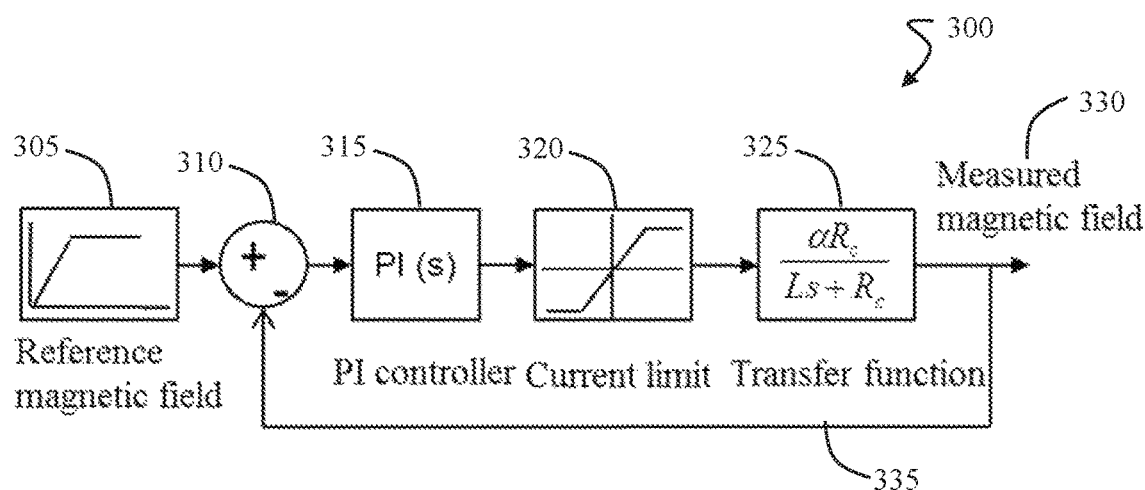
FIG. 3 is block diagram illustrating the proportional integral (PI) feedback control system for the NI HTS magnet, in accordance with an embodiment of the present invention.

FIG. 3 illustrates a block diagram of the proportional integral (PI) feedback control circuit 300 for the no-insulation coil, in accordance with the present invention. In the feedback control circuit 300 of the present invention, the PI controller 315 monitors the discrepancy 310 between the reference magnetic field 305 and the actual measured magnetic field 330. The PI controller 315 then controls the additional power supply current 320 in a feedback loop 335 to track the reference magnetic field 305 as long as the operation limits of the power supply voltage and power supply current exciting the magnetic coil are being met. The feedback loop 335 and the proportional integral controller 315 implement the previously defined transfer function 325 to provide a control signal to the power supply to control the power supply current during the excitation of the coil. During this procedure, the azimuthal current in the coil, which generates the center magnetic field, is usually smaller than the power supply current, mainly due to the radial leakage current through the turn-to-turn contacts of the coil.

In the exemplary embodiment, simulations were performed and experiments were conducted using a data acquisition system and an analog output controlled by software. In the experiments, the control signal from the PI feedback control circuit 300 was transferred to the current control terminals of the power supply through an analog output system.

In accordance with the transfer function of equation (4), the NI magnet is a first-order system that does not produce any control instability in the PI control. An ideal power supply with infinite current and voltage capacities may maximize the controllability, however, an actual power supply has voltage and current limits. Moreover, the maximum power supply current should be carefully determined in consideration of the operation details, e.g., current-carrying capacity of the REBCO tapes and extra Joule heat due to additional leakage current by an excessive power supply current.

In the experimental analysis, a power supply having respective voltage and current limits of 10 V and 400 A was utilized. To prevent over-current damage, the power supply was limited to 40 A in consideration of the current-carrying capacity of the REBCO tapes at 77 K in field. A Hall sensor, having a sensitivity of 1.66 mV T$^{-1}$ at an operating current of 4 mA, was installed at the center of the magnet to monitor the magnet center field during the feedback control.

Figure 4:
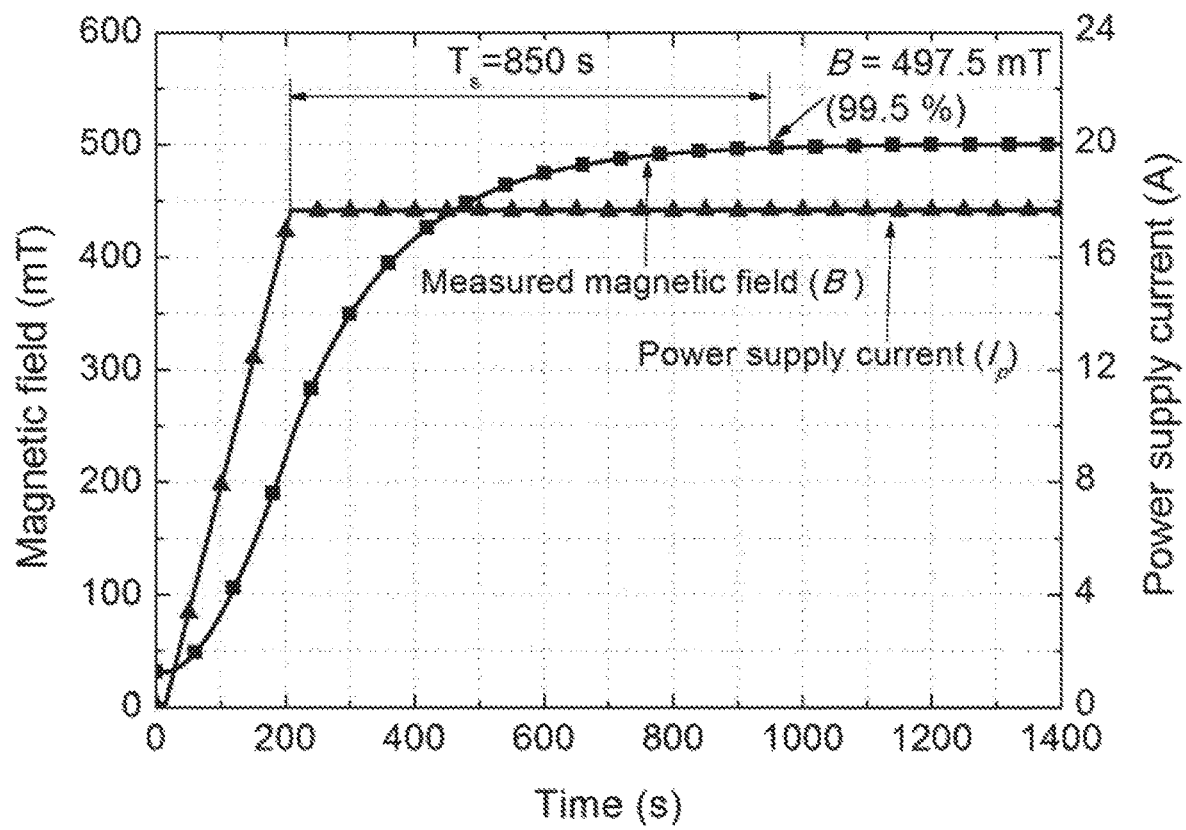
FIG. 4 is graphical illustration of the charging test results of an NI HTS magnet without feedback control, wherein the power supply current was increased to 17.7 A at a constant ramp rate of 0.09 A s$^{-1}$.

To verify the charging delay without feedback control, the initial experiments were performed by linear ramping of the power supply current up to 17.7 A at a ramp rate of 0.09 A s$^{-1}$, which corresponds to a magnet center field of 0.5 T. As shown in FIG. 4, the measured magnetic field demonstrates a significant delay with respect to the power supply current, wherein it achieved 99.5% of the target field (0.5 T) at approximately 850 s after the power supply current reached 17.7 A. Note that the choice of 99.5% is arbitrary, clearly insufficient in terms of the temporal stability requirement for NMR and MRI magnets.

Figure 5A:
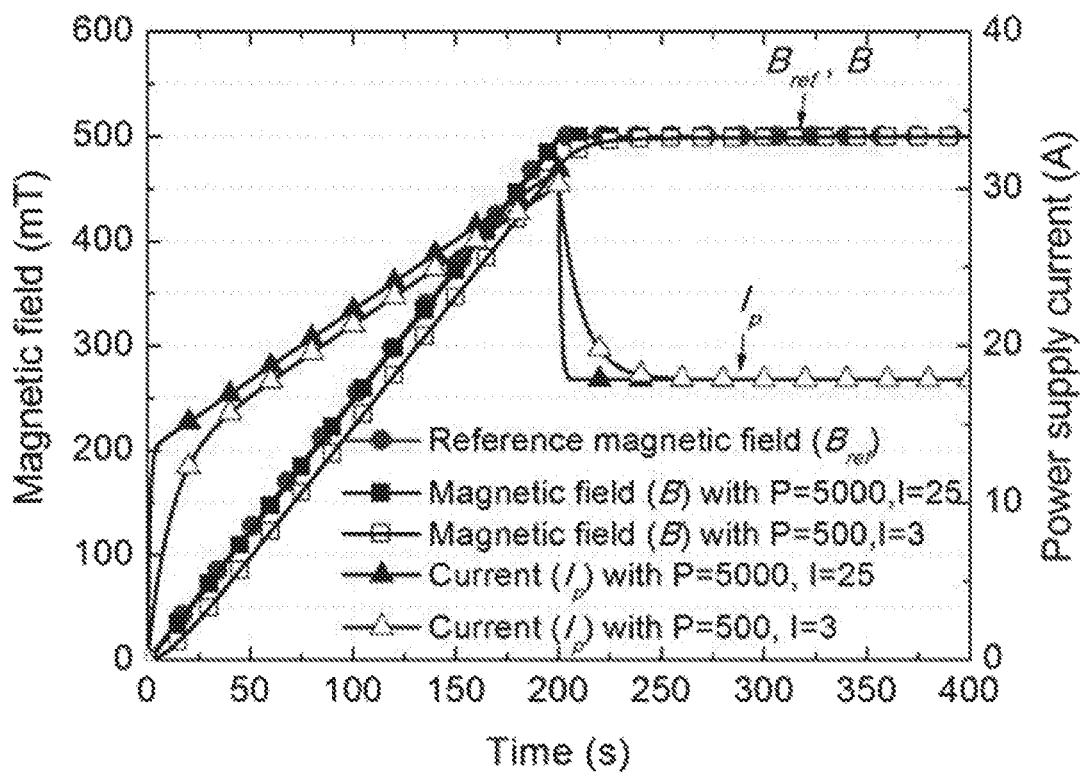
FIG. 5A is a graphical illustration of the simulations of the magnet center field versus time for the NI HTS magnet with feedback control having various P and I gains with a reference ramping rate of 2.5 mT s$^{-1}$, in accordance with an embodiment of the present invention.
Figure 5B:
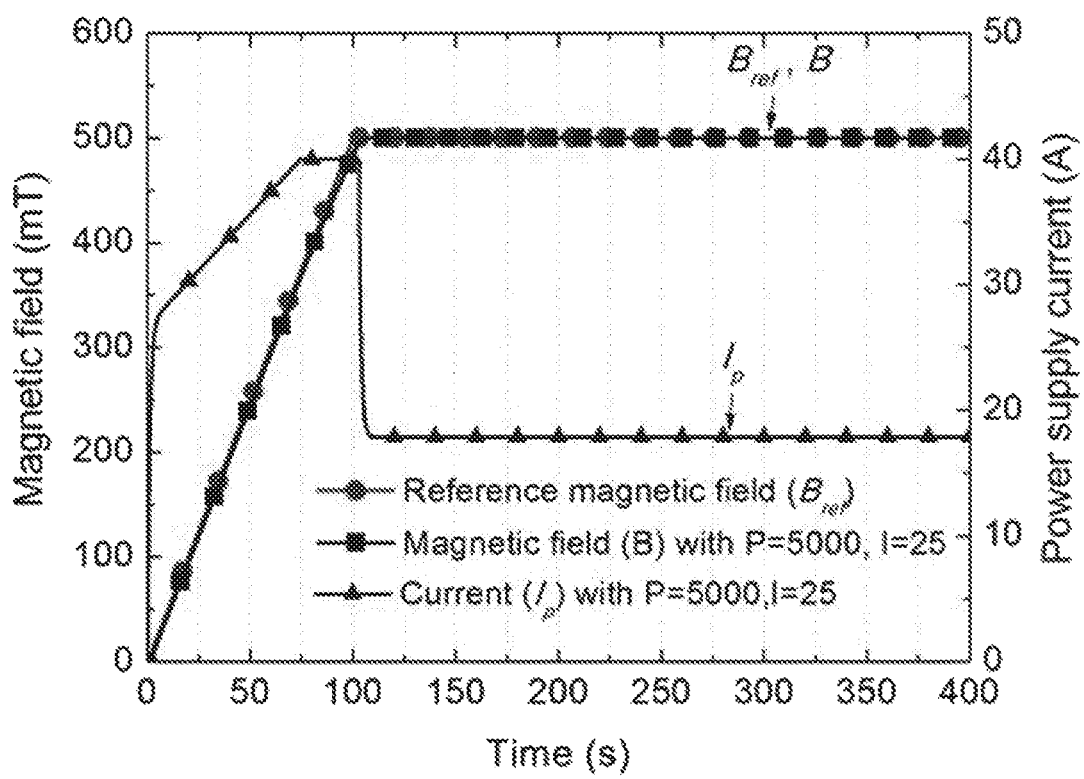
FIG. 5B is a graphical illustration of the simulations of the magnet center field versus time for the NI HTS magnet with feedback control having fixed P and I gains with a reference ramping rate of 5 mT s$^{-1}$, in accordance with an embodiment of the present invention.

Generally, a larger P-gain is preferred to reduce the control error in a first order system. Nonetheless, the maximum P-gain was set to be 5000 to suppress control instability arising from time delay of the digital control loop and limited resolution of the analog-to-digital converter control signal. Furthermore, the I-gain was selected to reduce the residual error within a range needed to avoid an overshoot response. FIG. 5A and FIG. 5B illustrate simulation results of magnetic field versus time with the feedback control of the present invention. FIG. 5A compares the results with different PI gains when the reference signal ramping rate ($dB_{ref}/dt$) was set to be 2.5 mT s$^{-1}$. FIG. 5B presents results with a faster reference signal ramping rate, 5 mT s$^{-1}$ with given P and I gains of 5000 and 25, respectively. As shown in FIG. 5B, the errors between the reference and control values decrease as the PI gain increases. At 2.5 mT s$^{-1}$, the maximum power supply current was only 32 A, while it was limited to 40 A to avoid the coil damage for the faster ramp of 5 mT s$^{-1}$.

Figure 6A:
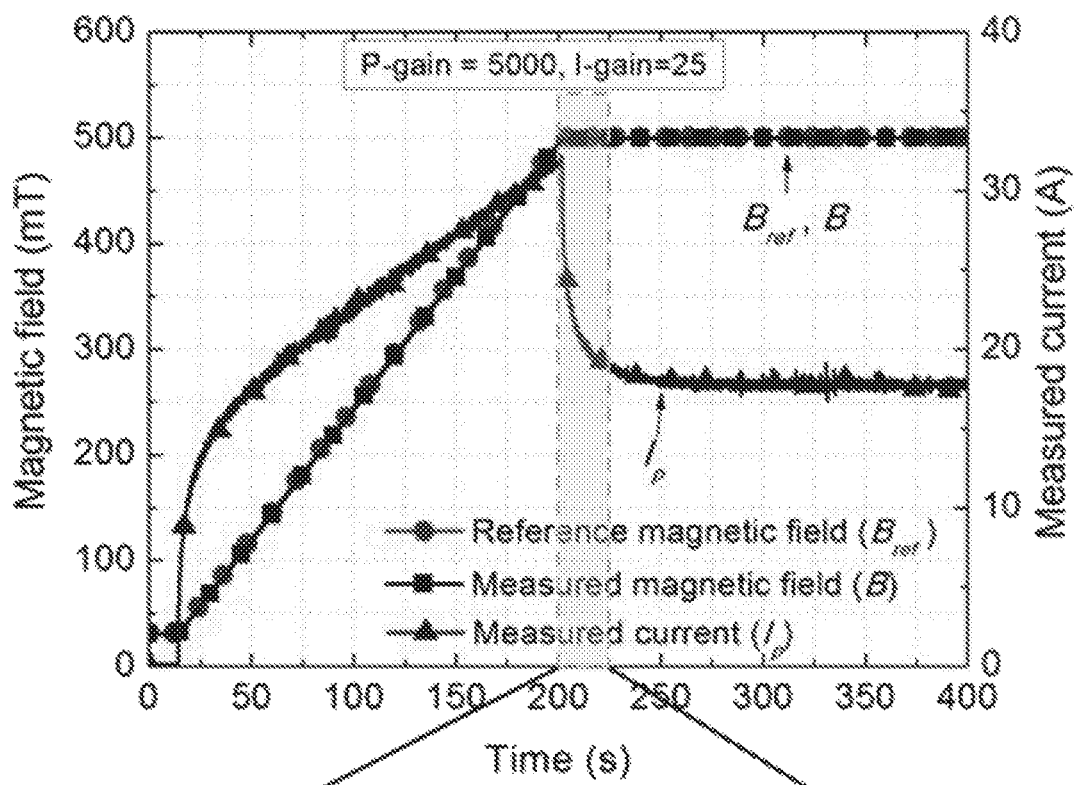
FIG. 6A is a graphical illustration of the test results of the NI HTS magnet with the feedback control having a reference signal ramping rate of 2.5 mT s$^{-1}$, a P-gain of 5000 and an I-gain of 25, in accordance with an embodiment of the present invention.
Figure 6B:
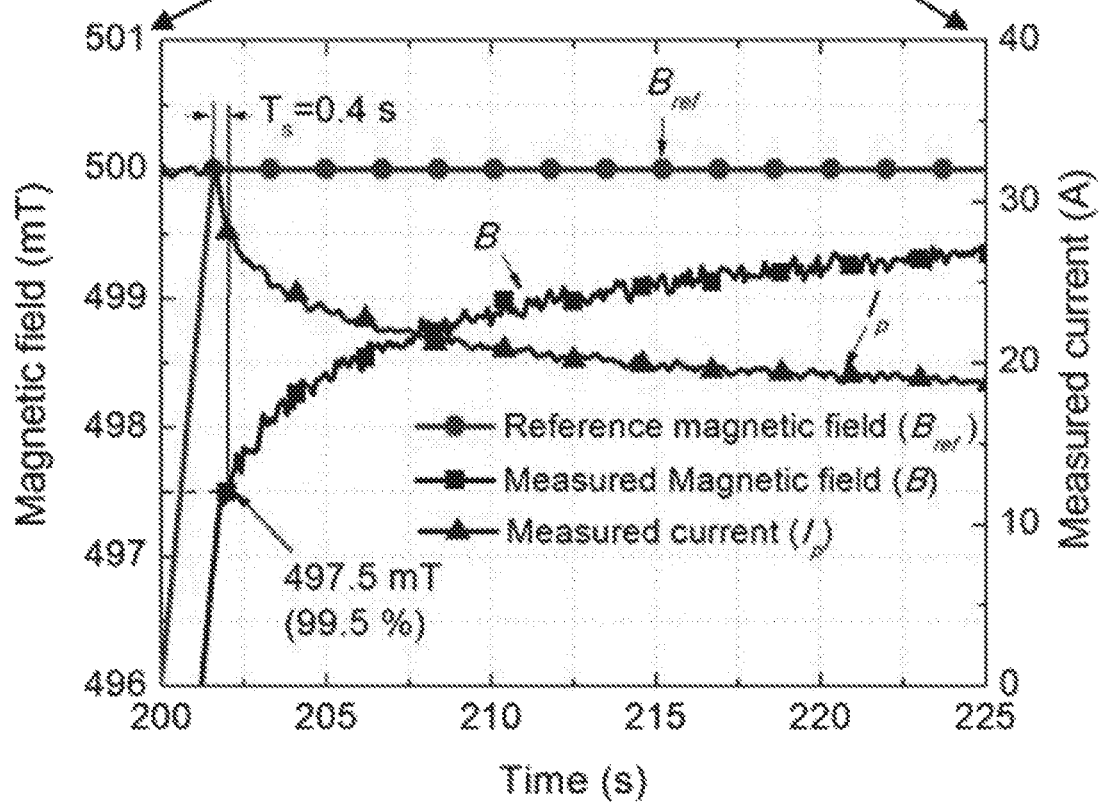
FIG. 6B is a graphical illustration of an exploded view of the time between 200 s and 225 s of FIG. 6A.

FIG. 6A and FIG. 6B illustrates the experimental results for the 2.5 mT s$^{-1}$ case with respective PI gains of 5000 and 25, which shows good agreement with the simulation results in FIG. 5A. Both simulation and experiment results demonstrate that the charging delay was reduced by more than 2000 times, from 850 s without feedback control to 0.4 s with the implementation of the feedback control system of the present invention.

A residual field of 31 mT was observed in FIG. 6A and FIG. 6B before the charging was started, mainly due to the screening current in the REBCO tapes. However, the screening-current-induced field was considered as a disturbance in the control system and thus mitigated during the control, which may have been challenging otherwise without the control.

The advantages set forth above, and those made apparent from the foregoing description, are efficiently attained. Since certain changes may be made in the above construction without departing from the scope of the present disclosure, it is intended that all matters contained in the foregoing description or shown in the accompanying drawings shall be interpreted as illustrative and not in a limiting sense.

It is also to be understood that the following claims are intended to cover all of the generic and specific features of the disclosure herein described, and all statements of the scope of the disclosure that, as a matter of language, might be said to fall there between.

What is claimed is:

1. A method comprising:
   establishing a reference magnetic field for a no-insulation (NI) high-temperature superconductor (HTS) coil;
   exciting the NI HTS coil with a power supply;
   monitoring a difference between the reference magnetic field and a measured magnetic field of the NI HTS coil; and
   controlling, in accordance with a transfer function, a current of the power supply, wherein the transfer function includes a ratio of a product of a magnetic constant of the NI HTS coil and a contact resistance of the NI HTS coil and a sum of a magnet inductance of the NI HTS coil and the contact resistance.

2. The method of claim 1, wherein the method further comprises limiting the maximum power supply current to protect the NI HTS coil.

3. The method of claim 1, wherein the reference magnetic field establishes a linear ramp up to a predetermined magnetic field strength at a predetermined rate of increase of the power supply current.

4. The method of claim 1, wherein the NI HTS magnet is a double-pancake (DP) magnet comprising a plurality of different rare-earth barium copper oxide (REBCO) tape widths.

5. The method of claim 1, further comprising measuring the magnetic field of the NI HTS coil to generate the measured magnetic field.

6. The method of claim 1, wherein controlling the current of the power supply is further based on a feedback loop based on the difference between the reference magnetic field and the measured magnetic field.

7. The method of claim 1, wherein the ratio of the measured magnetic field ($\tilde{B}$) of the NI HTS coil and the current of the power supply ($\tilde{I}p$) and is equal to:

$$\frac{\tilde{B}(s)}{\tilde{I}_P(s)} = \frac{\alpha R_c}{L_s + R_c}$$

wherein, $\alpha$ is a magnetic constant of the NI HTS coil, Rc is a contact resistance of the NI HTS coil and L is the magnet inductance of the NI HTS coil.

8. A system comprising:
   a reference magnetic field for a no-insulation (NI) high-temperature superconductor (HTS) coil;
   a magnetic field sensor coupled to the NI HTS coil, the magnetic field sensor to output a measured magnetic field of the NI HTS coil; and
   a proportional integral (PI) controller coupled to the reference magnetic field and to the output of the magnetic field sensor, the PI controller configured to:
   monitor a difference between the reference magnetic field and a measured magnetic field of the NI HTS coil; and
   control, in accordance with a transfer function, a current of a power supply, wherein the transfer function includes a ratio of a product of a magnetic constant of the NI HTS coil and a contact resistance of the NI HTS coil and a sum of a magnet inductance of the NI HTS coil and the contact resistance.

9. The system of claim 8, wherein the PI controller is further for limiting the maximum power supply current to protect the NI HTS coil.

10. The system of claim 8, wherein the reference magnetic field establishes a linear ramp up to a predetermined magnetic field strength at a predetermined rate of increase of the power supply current.

11. The system of claim 8, wherein the NI HTS magnet is a double-pancake (DP) magnet comprising a plurality of different rare-earth barium copper oxide (REBCO) tape widths.

12. The system of claim 8, wherein the controller is further configured to measure the magnetic field of the NI HTS coil to generate the measured magnetic field.

13. The system of claim 8, wherein controlling the current of the power supply is further based on a feedback loop based on the difference between the reference magnetic field and the measured magnetic field.

14. The system of claim 8, wherein the ratio of the measured magnetic field ($\tilde{B}$) of the NI HTS coil and the current of the power supply ($\tilde{I}p$) and is equal to:

$$\frac{\tilde{B}(s)}{\tilde{I}_P(s)} = \frac{\alpha R_c}{L_s + R_c}$$

wherein, α is a magnetic constant of the NI HTS coil, Rc is a contact resistance of the NI HTS coil and L is the magnet inductance of the NI HTS coil.

15. A non-transitory computer-readable medium storing computer-executable instructions, that when executed by at least one processor, cause the at least one processor to perform operations of:
   establishing a reference magnetic field for a no-insulation (NI) high-temperature superconductor (HTS) coil;
   exciting the NI HTS coil with a power supply;
   monitoring a difference between the reference magnetic field and a measured magnetic field of the NI HTS coil; and
   controlling, in accordance with a transfer function, a current of the power supply, wherein the transfer function includes a ratio of a product of a magnetic constant of the NI HTS coil and a contact resistance of the NI HTS coil and a sum of a magnet inductance of the NI HTS coil and the contact resistance.

16. The non-transitory computer-readable medium of claim 15, wherein the computer-executable instructions further cause the at least one processor to perform operations of:
   limiting the maximum power supply current to protect the NI HTS coil.

17. The non-transitory computer-readable medium of claim 15, wherein the reference magnetic field establishes a linear ramp up to a predetermined magnetic field strength at a predetermined rate of increase of the power supply current.

18. The non-transitory computer-readable medium of claim 15, wherein the NI HTS magnet is a double-pancake (DP) magnet comprising a plurality of different rare-earth barium copper oxide (REBCO) tape widths.

19. The non-transitory computer-readable medium of claim 15, further comprising measuring the magnetic field of the NI HTS coil to generate the measured magnetic field.

20. The non-transitory computer-readable medium of claim 15, wherein controlling the current of the power supply is further based on a feedback loop based on the difference between the reference magnetic field and the measured magnetic field.

\* \* \* \* \*